United States Patent [19]

Eggleston

[11] Patent Number: 5,617,059
[45] Date of Patent: Apr. 1, 1997

[54] POWER AMPLIFIER, AND ASSOCIATED METHOD, FOR A MICROWAVE REPEATER STATION

[75] Inventor: Brian E. Eggleston, Pittstown, N.J.

[73] Assignee: SSB Technologies, Inc., Union, N.J.

[21] Appl. No.: 499,635

[22] Filed: Jul. 7, 1995

[51] Int. Cl.⁶ .................................. H03F 1/30; H04B 3/36
[52] U.S. Cl. .................................. 330/66; 330/189; 455/7
[58] Field of Search .................................. 330/65, 66, 68, 330/189; 257/706, 707, 112; 341/707, 709, 714, 719, 720, 722; 178/70 S, 70 TS; 375/211; 455/7, 14, 90

[56] References Cited

U.S. PATENT DOCUMENTS

| | | |
|---|---|---|
| 3,382,445 | 5/1968 | Williams et al. .................... 330/289 |
| 3,593,174 | 7/1971 | White . |
| 3,963,993 | 6/1976 | Hoffman et al. . |
| 3,987,344 | 10/1976 | Ambruoso, Sr. et al. ............ 361/708 |
| 4,263,559 | 4/1981 | Ho . |
| 4,320,353 | 3/1982 | Sasaki . |
| 4,477,781 | 10/1984 | Reuss, Jr. . |
| 4,485,349 | 11/1984 | Siegel et al. . |
| 4,588,962 | 5/1986 | Saito et al. . |
| 4,647,868 | 3/1987 | Mueller . |
| 4,647,869 | 3/1987 | Kaneko et al. . |
| 4,965,530 | 10/1990 | Katz . |
| 5,146,175 | 9/1992 | Green, Jr. . |
| 5,206,608 | 4/1993 | Torres . |
| 5,208,554 | 5/1993 | Endler et al. . |
| 5,214,394 | 5/1993 | Wong . |
| 5,264,810 | 11/1993 | Sager et al. . |
| 5,274,340 | 12/1993 | Deki et al. . |
| 5,352,991 | 10/1994 | Lipschultz et al. .................... 330/65 X |
| 5,420,537 | 5/1995 | Weedon et al. . |

FOREIGN PATENT DOCUMENTS 18810  1/1988  Japan .................................. 330/289

Primary Examiner—James B. Mullins
Attorney, Agent, or Firm—Lee R. Osman

[57] ABSTRACT

A microwave amplifier for amplifying microwave signals, such as the microwave signals received by a microwave repeater station. The amplifier is formed of solid state amplifier-transistors to which the microwave signals are applied by way of transmission lines. The amplification circuitry and transmission lines are formed upon a circuit board which is housed within a heat-dissipative housing. The amplifier can be used in substitution for a conventional travelling wave tube, conventionally utilized to amplifier microwave signals received at a microwave repeater station.

19 Claims, 5 Drawing Sheets ent invention relates generally to amplifiers for
POWER AMPLIFIER, AND ASSOCIATED METHOD, FOR A MICROWAVE REPEATER STATION

BACKGROUND OF THE INVENTION

The present invention relates generally to amplifiers for amplifying microwave signals. More particularly, the present invention relates to a solid state power amplifier, and an associated method, for a microwave repeater station.

A communication system includes, at a minimum, a transmitter and a receiver interconnected by a communication channel. In a wireless communication system, the communication channel is formed of a frequency channel upon which modulated signals generated by the transmitter are transmitted to a remotely-located receiver.

A wireless communication system is of particular utility when a wireline connection between the transmitter and the receiver is impractical, either physically or economically. Wireless communication systems are widely utilized, for instance, in the telecommunications industry to effectuate long-distance, telephonic communications.

A microwave communication system is an example of a wireless communication system sometimes utilized to effectuate telephonic communications. A microwave communication system includes a microwave transmitter for generating and transmitting communication signals modulated at microwave frequencies. A microwave receiver also forms a portion of a microwave communication system to receive the microwave signals transmitted by the microwave transmitter. Typically, a large number of microwave signals are simultaneously generated and transmitted upon different frequency channels. In some microwave communication systems used to effectuate telephonic communications, several hundred or more signals are simultaneously modulated and transmitted by a single microwave transmitter.

When the signals must be transmitted over significant distances, intermediary, microwave repeater stations are sometimes required to be utilized. A repeater station includes a microwave receiver, a microwave amplifier, and a microwave transmitter which together are operative to receive microwave signals transmitted thereto, to amplify the received microwave signals, and to retransmit the microwave signals, once amplified. Several, or many, spaced-apart repeaters can be positioned to receive, amplify, and retransmit microwave signals over very large distances between a source transmitter and a destination receiver.

Conventional amplifying circuitry for amplifying microwave signals typically utilizes a traveling wave tube (TWT). In general, a traveling wave tube typically includes a cathode which creates an electron beam to which a received, radio-frequency (RF) signal is coupled. The electron beam causes amplification of the signal by utilizing a high current, referred to as a "cathode current." To generate such a cathode current, a large, and fairly complex, high-energy power supply is required. Not only is the high-energy power supply susceptible to failure over time, but, additionally a significant amount of thermal energy is generated during operation of the TWT. The large cathode current, in combination with the heat generated by the cathode current, over time acts to deteriorate the components and performance of the TWT and causes the TWT to be inherently susceptible to failure. Either failure of the power supply or the TWT itself can necessitate replacement of the TWT.

Repair and replacement expenses are incurred when a TWT fails.

An amplifier for a microwave repeater station which avoids the disadvantages associated with conventional traveling wave tubes, would therefore be advantageous.

It is with respect to these considerations and other background information relative to microwave amplifiers that the significant improvements of the present invention have evolved.

SUMMARY OF THE INVENTION

In accordance with the present invention, therefore, a solid state power amplifier amplifies microwave signals. A supportive housing includes a first side at which an input element is positioned. The input element receives microwave signals. An input transmission line is coupled to the input element and transmits the microwave signals applied to the input element therealong. At least one transistor-amplifier element is coupled to receive and to amplify the microwave signals transmitted upon the input transmission line. An output transmission line is coupled to the transistor-amplifier element for transmitting the microwave signals, once amplified by the transistor-amplifier element, therealong. An output element is positioned at the first side of the supportive housing, positioned in-line with the input element, and coupled to the output transmission line for receiving the microwave signals transmitted along the output transmission line. A passive, heat-dissipative element is positioned together with the housing for dissipating heat generated during operation of the solid state amplifier, wherein the microwave signals are transmitted along the input and output transmission lines, respectively, and amplified by the amplifier.

The present invention advantageously provides a solid state power amplifier, and an associated method, for amplifying microwave signals. Thermal energy generated as a byproduct of operation can be dissipated with passive heat-dissipative elements.

The solid state power amplifier can be substituted into a microwave repeater station for a traveling wave tube (TWT) conventionally utilized to amplify microwave signals at a microwave repeater station. The solid state power amplifier requires lesser amounts of power for operation and generates less thermal energy during operation thereof than does a conventional, traveling wave tube. Thermal energy generated during operation of the solid state power amplifier can be dissipated with passive, heat-dissipative elements. Because the amplifier is formed of solid-state elements, the solid state power amplifier is relatively longer-lasting than a conventional traveling wave tube.

The present invention further advantageously provides a solid state power amplifier of dimensions corresponding to the dimensions of a conventional traveling wave tube, conventionally utilized to amplify signals at a microwave repeater station. When a conventional traveling wave tube is replaced, the solid state power amplifier of the present invention can be substituted for the traveling wave tube without any alteration to the microwave repeater station.

A more complete appreciation of the present invention and the scope thereof can be obtained from the accompanying drawings which are briefly summarized below, the following detailed description of the presently-preferred embodiments of the invention, and the appended claims.

DETAILED DESCRIPTION

Figure 1:
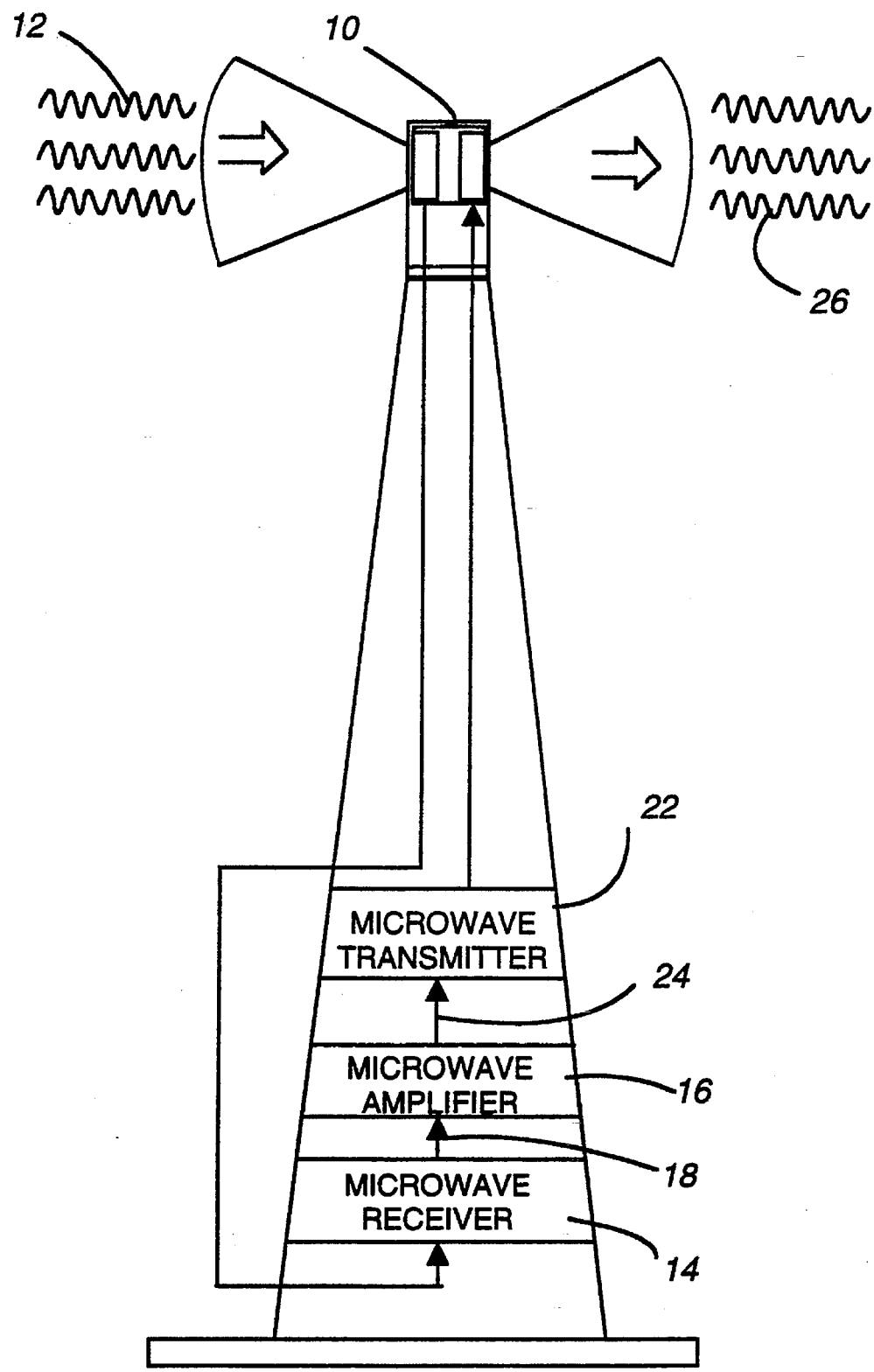
FIG. 1 is a partial functional block, partial perspective view of a microwave repeater station which incorporates the amplifier of an embodiment of the present invention as a portion thereof.

FIG. 1 illustrates a microwave repeater station, shown generally at 10, which includes an amplifier 16 implemented in accordance with an embodiment of the present invention. The microwave repeater station 10 receives a plurality of microwave signals 12 transmitted by a remote, microwave transmitter (not shown). The repeater station 10 includes a microwave receiver 14 for receiving the microwave signals 12 transmitted thereto. The microwave receiver is coupled to a microwave amplifier 16 by way of lines 18. The signals received by the receiver 14 are amplified by the amplifier 16.

The microwave signals, once amplified by the amplifier 16, are applied to a microwave transmitter 22 by way of lines 24. The transmitter 22 retransmits the microwave signals received by the microwave receiver 14 and amplified by the amplifier 16. The signals 26 representative of the signals generated by the transmitter 22 are transmitted to another microwave receiver (not shown).

A microwave communication system may include a plurality of microwave repeater stations similar to the repeater station 10 positioned between a source transmitter and a destination receiver, thereby to permit the source transmitter and the destination receiver to be separated by significant distances.

As mentioned hereinabove, conventional, repeater stations typically utilize a traveling wave tube (TWT) to form the amplifier 16 which amplifies the microwave signals received at the repeater station. Such conventional, traveling wave tubes usually require a relatively large power source for operation and also require a heat-dissipative element to dissipate thermal energy generated as a byproduct of operation. Failure of either the power source or the TWT itself necessitates replacement of the TWT. Conventional microwave repeater stations are typically constructed to permit ready removal and replacement of an amplifier formed of a traveling wave tube. Once a failed amplifier is substituted with a working amplifier, the repeater station can be made operative again to amplify and retransmit microwave signals.

As shall be described in greater detail below, the solid state amplifier embodying the present invention has dimensions corresponding to the dimensions of a conventional traveling wave tube (TWT) and is constructed to permit substitution of the solid state power amplifier for a conventional traveling wave tube.

Because the solid state power amplifier of the present invention is a solid state device, it requires relatively small amounts of power for operation, and only a passive, heat-dissipative element is required to dissipate thermal energy during operation of the amplifier. The amplifier is less susceptible to failure than the conventional TWT, and installation of such an amplifier at a microwave repeater station improves the reliability of the repeater station due to the greater reliability of the amplifier itself.

Figure 2:
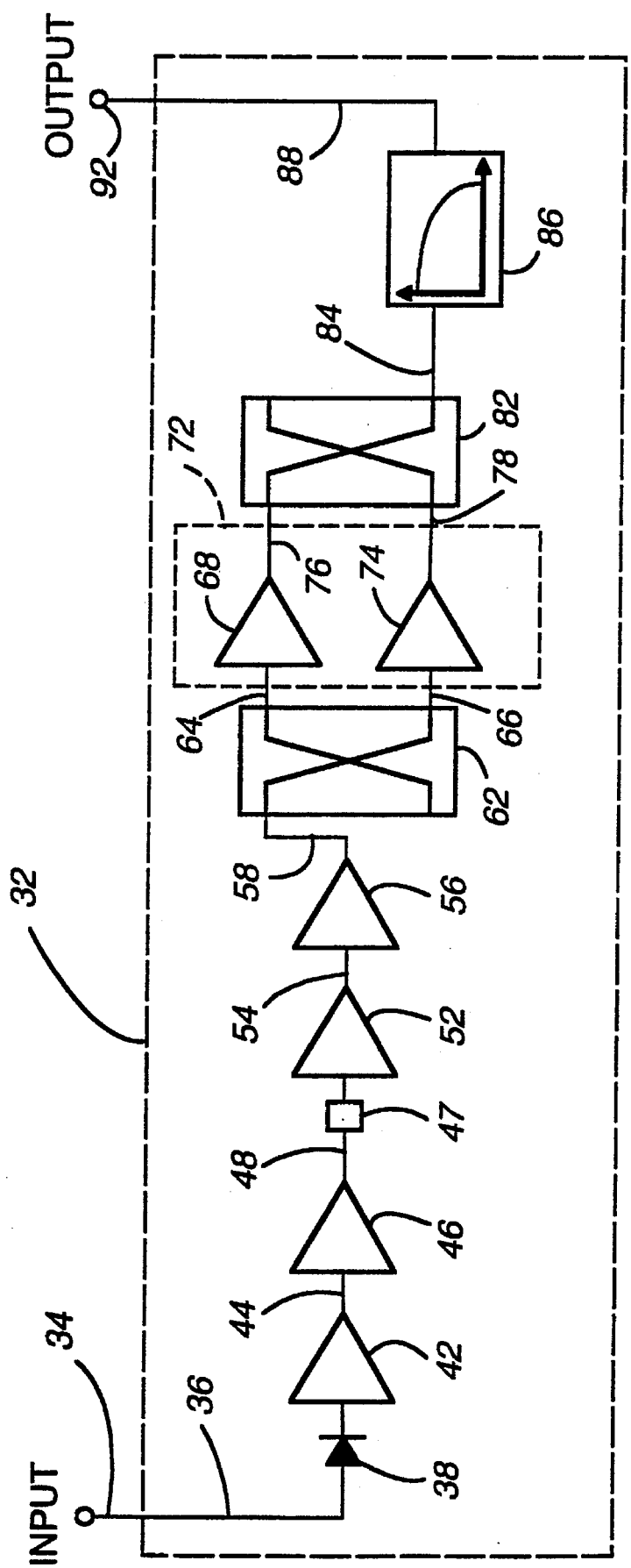
FIG. 2 is a circuit block diagram of the circuitry of an amplifier of an embodiment of the present invention.

FIG. 2 illustrates the circuitry of the amplifier 16 which forms a portion of the microwave repeater station 10 shown in FIG. 1. The amplifier 16 amplifies microwave signals which can operate, for instance, at frequencies of 6 GHz. The amplifier 16 may similarly be utilized to amplify microwave signals of lesser or greater frequencies, such as microwave signals at 11 GHz.

The circuit elements of the amplifier 16 includes elements which are disposed upon a circuit board 32 upon which transmission lines formed of microstrip are located. The circuit board, as shall be noted below, in one embodiment, is formed of several discrete sections. And, the microstrip in one embodiment are formed of a copper or copper-alloy material.

The amplifier 16 includes an input element 34 which forms a coupler for receiving the microwave signals at the microwave repeater station 10. The input element 34 is coupled to an input transmission line, here an input microstrip 36. Microwave signals applied to the input element 34 are transmitted along the microstrip 36.

A temperature compensation diode 38 is positioned in-line with the microstrip 36. In conventional manner, the electrical characteristics of the diode 38 are altered responsive to changes in temperature. By suitable selection of the characteristics of the diode 38, the diode is operative to counteract the effects on the amplifier of changes in temperature of the environment around the amplifier 16.

The microstrip 36 forming the input transmission line extends to a first amplifier stage 42 formed of a cascaded series of amplifier stages. The amplifier stage 42 amplifies the microwave signals applied thereto with a first level of gain. Amplifier stage 42 generates amplified microwave signals with the first level of gain upon a microstrip 44 which is coupled to a second amplifier stage 46. In one embodiment, the amplifier stage 42 is formed of an NEC NE90089 transistor amplifier and the amplifier stage 46 is formed of a Fujitsu FLC053WG amplifier.

The second amplifier stage 46 amplifies the microwave signals applied thereto with a second level of gain and generates amplified signals with a second level of gain upon a microstrip 48. The amplified signal from the second amplifier stage 46, transmitted along the microstrip 48, passes through a leveling pad 47. The leveling pad 47 decreases the power of the amplified signal output from the second amplifier stage 46 in order to prevent overdrive of the third amplifier stage 52. Leveling pad 47 can be, for instance, a pi network of chip resistors which values are selected for a desired power attenuation.

The microstrip 48 is coupled to an input of a third amplifier stage 52. The third amplifier stage 52 applies a third level of gain to the microwave signals applied thereto and generates signals with a third level of gain upon a microstrip 54. In one embodiment, the amplifier stage 52 is formed of an NEC NE800296 amplifier.

The microstrip 54 is coupled to a fourth amplifier stage 56 which applies a fourth level of gain to the microwave signals applied thereto and generates amplified signals with the fourth level of gain on a microstrip 58. In one embodiment, the amplifier stage 56 is formed of a Fujitsu FLM5964-6D amplifier. The microstrip 58 extends to and is coupled with a microstrip signal splitter 62. The signal splitter 62 forms two separate, and parallel, microstrip signal paths 64 and 66. Each path is operative to transmit portions of the amplified signals generated by the fourth amplifier stage 56.

The signal path 64 extends to an amplifier 68 of a fifth amplifier stage 72. In one embodiment, the fifth amplifier stage is formed of parallel-Fujitsu FLM59674-12A amplifiers. The signal path 66 extends to an amplifier 74 of the fifth amplifier stage 72. The amplifiers 68 and 74 amplify the microwave signals applied thereto on the signal paths 64 and 66, respectively, with fifth levels of gain. Amplified signals amplified with the fifth levels of gain are generated upon microstrip signal paths 76 and 78, respectively. The signal paths 76 and 78 extend to and are coupled with a microstrip signal recombiner 82. The signal recombiner 82 combines the signals on paths 76 and 78 into a signal on microstrip signal path 84.

The signal path 84 extends to a microstrip low-pass filter 86 which filters the amplified microwave signals applied thereto and forms filtered signals which are applied to an output transmission line, here being output microstrip 88. The amplified, and filtered, microwave signals are transmitted along the microstrip 88 to an output element 92. As shall be noted below, the output element 92 and the input element 34 are positioned in-line with one another.

The amplifier stages 42, 46, 52, 56, and 72 are each formed of gallium arsenide (GaAs) transistor-amplifiers. The power requirements of such amplifier stages, which amplify the microwave signals applied to the amplifier 16, are reduced relative to the power requirements of a conventional TWT.

Because of the inherent reliability of solid state circuits, a more reliable circuit is formed. Also because of the lesser amounts of power are required for operation of the amplifier 16, a lesser amount of thermal energy is generated as a byproduct of operation of the amplifier. Because less thermal energy is generated, the amplifier 16 is less susceptible to failure due to the deleterious effects of high temperatures upon the circuitry of the amplifier. Also, the amplifier 16 only requires a passive, heat-dissipative element.

The exemplary amplifiers noted above of the various amplifier stages are selected to permit operation of the amplifier 16 out-of-saturation. Such operation permits preservation of the envelopes of the microwave signals when the information-content of the microwave signals is contained, at least in part, in the signal envelopes of the signals. The amplifier 16 is therefore capable of amplifying a complex-modulated signal, such as a differential, quadrature phase shift keying (QPSK), modulated signal. When the signal envelopes need not be preserved, the amplifier stages can be operated in saturation and the elements forming the various amplifier stages can be selected accordingly.

Figure 3:
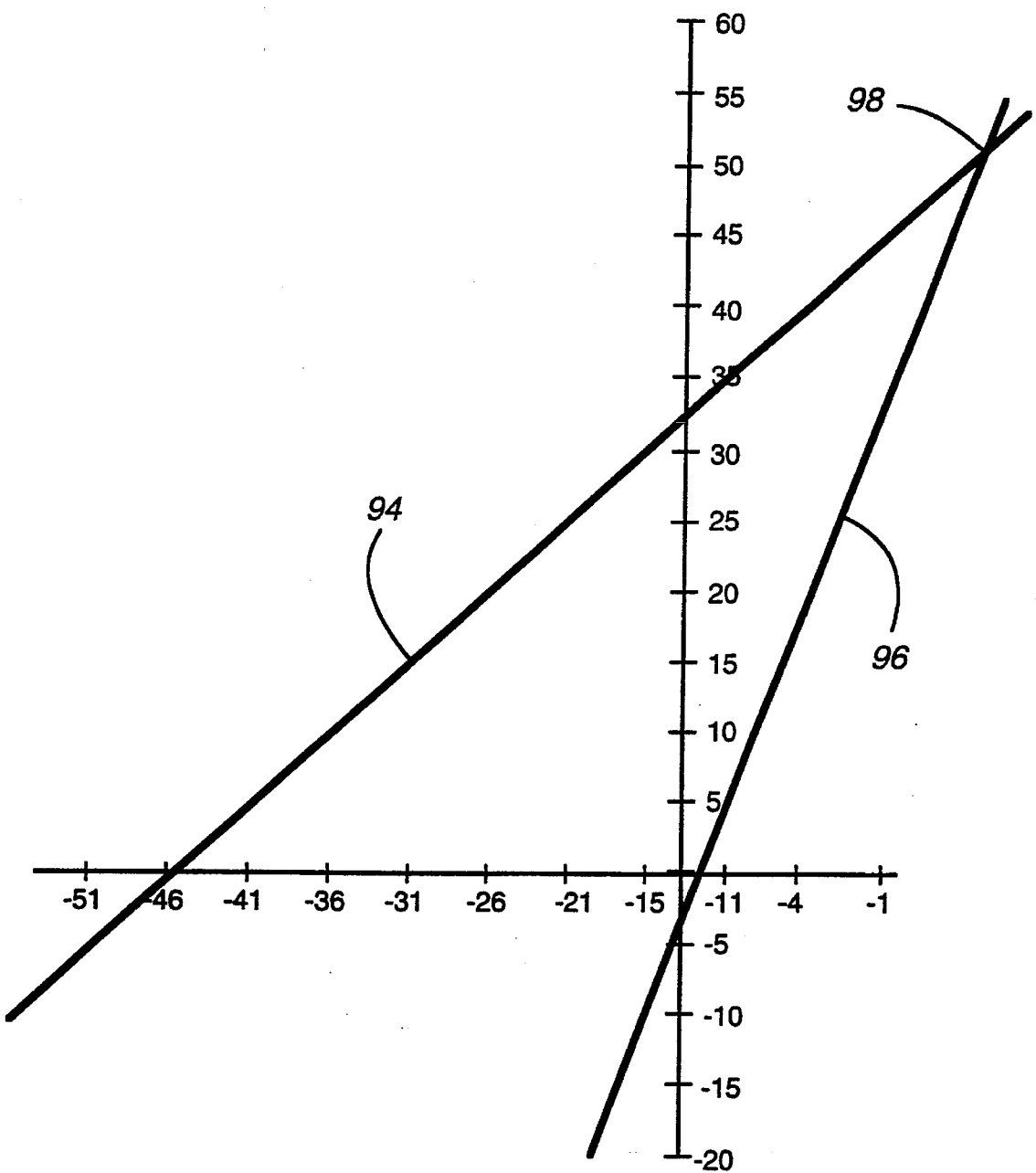
FIG. 3 is a graphical representation illustrating the characteristics of the amplifier shown in FIG. 2.

FIG. 3 illustrates graphically the characteristics of the amplifier 16 in one embodiment of the present invention. The characteristics illustrated in FIG. 3 are exemplary only. Amplifiers of other characteristics can, of course, be constructed by altering the gain and phase characteristics of the circuit elements of the amplifier 16.

The graphical representation of FIG. 3 is a plot of the nominal gain, represented by the curve 94, of the amplifier 16. The curve 94 is formed by plotting the gain, scaled in terms of dB plotted as a function of single carrier level along the abscissa axis, scaled in terms of dBm.

A curve 96 is further plotted in the figure. The curve 96 is representative of a third order product of the amplifier. The curves 94 and 96 intercept at a third order intercept point 98, here at a dBm level of 51 dBm.

The exemplary characteristics shown in FIG. 3 of the amplifier 16 are representative of the characteristics of an amplifier operative in a microwave repeater station operative to receive 64-QAM signals. It should be understood, of course, that the amplifier 16 can have characteristics other than the exemplary characteristics shown in FIG. 3.

Further, it should be understood that the number of amplifier stages are selected in the illustrated embodiment to permit commercially-available GaAs transistor amplifiers to be utilized to form an amplifier having the characteristics shown in FIG. 3. In other embodiments, other numbers of amplifier stages can be selected, as necessary, to form an amplifier of desired characteristics.

Figure 4:
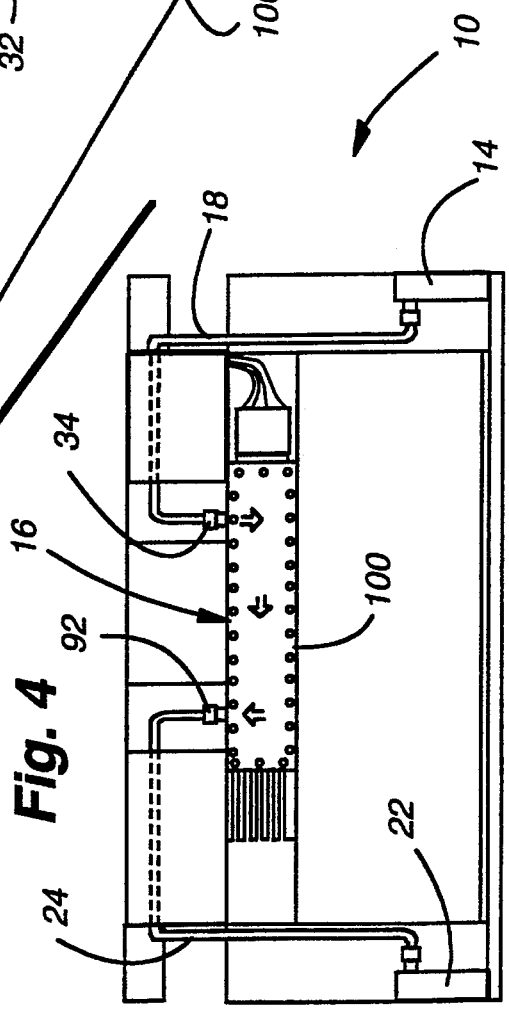
FIG. 4 is a plan view of a portion of the microwave repeater station shown in FIG. 1.

FIG. 4 illustrates a portion of the microwave repeater station 10, shown previously in FIG. 1. The portion of the repeater station 10 shown in the figure illustrates the amplifier 16 connected to receive and to transmit microwave signals, once amplified by the amplifier. Microwave signals received by the microwave receiver 14 (shown in FIG. 1) are generated on line 18, here a coaxial cable 18, which is coupled to the input element 34 of the amplifier 16. The microwave signals are applied, by way of the input element 34, to the circuit elements shown in FIG. 2 of the amplifier, transmission lines formed upon the circuit board 32, such elements being housed within a housing 100. The microwave signals applied to the amplifier 16 are amplified by transistor-amplifier elements, and the microwave signals, once amplified, are supplied to the output element 92 for transmission upon the line 24, here a coaxial cable. The coaxial cable 24 is again shown to be coupled to the microwave transmitter 22.

The dimensions of the amplifier 16 correspond to the dimensions of a conventional TWT, and the input and output elements 34 and 92 are positioned at the same locations of corresponding structure of a conventional TWT. Because of such corresponding dimensions, when a conventional TWT installed at a microwave repeater station fails, the conventional TWT can be replaced with the amplifier 16.

Figure 5:
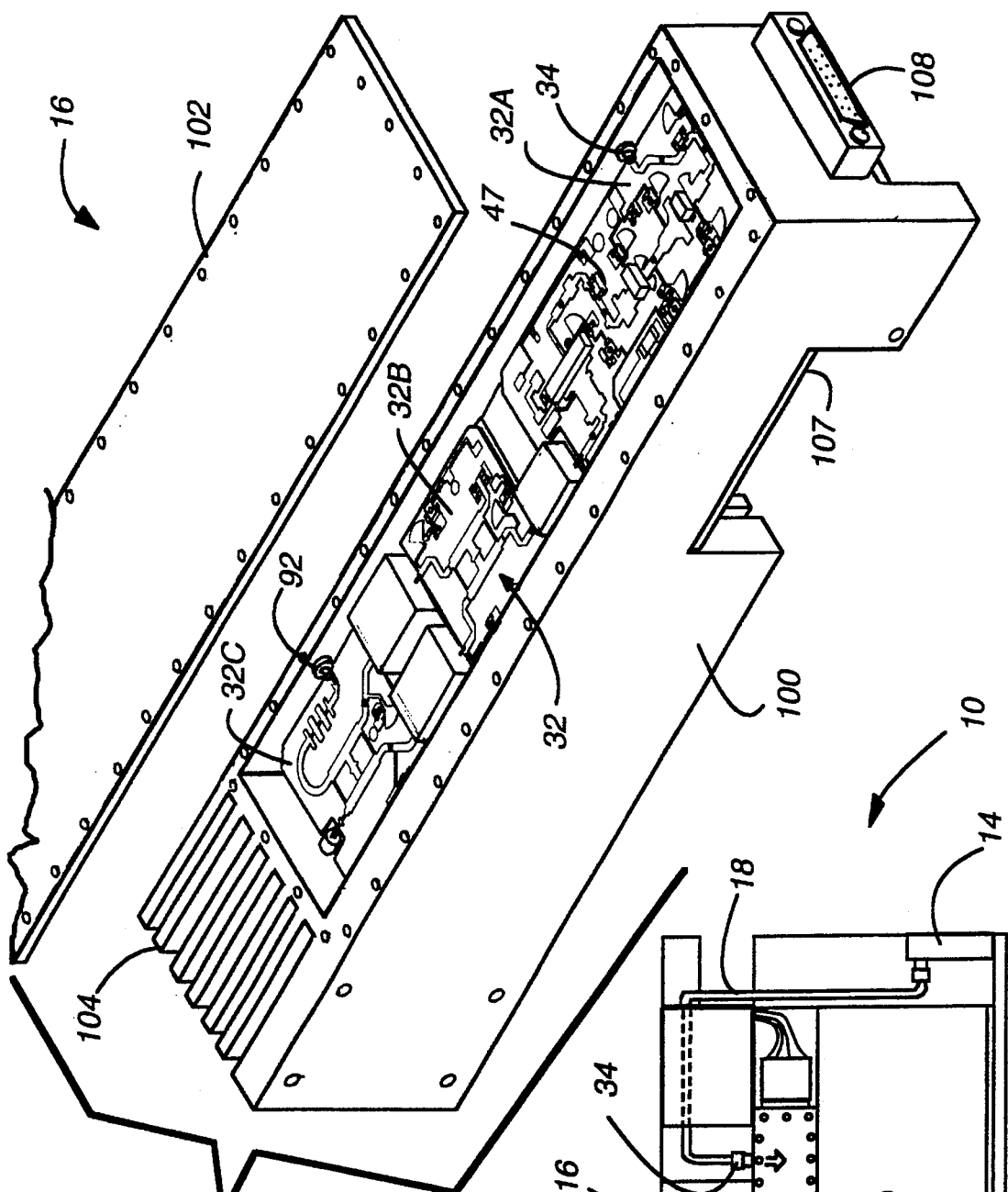
FIG. 5 is a partially-exploded, perspective view of the amplifier shown in circuit block form in FIG. 2.

The exploded view of FIG. 5 again illustrates a preferred embodiment of the amplifier of the present invention. The housing 100 supportively encloses the circuit board 32, here formed of circuit board sections 32A, 32B, and 32C, upon which, or to which, the amplifier circuitry of the amplifier 16 is formed. The housing 100 also forms a ground plane. A top cover 102 of the housing 100 covers a top side of the circuit board 32 to enclose the top circuit of the circuit board. A plurality of heat-dissipative fins 104 are formed integral with the housing 100.

As the circuit board sections 32A, 32B, and 32C and certain of the amplifier stages seat upon the housing 100, thermal energy generated as a byproduct of amplification of the microwave signals applied to the amplifier 16 are conducted away from the amplifier elements formed upon the circuit board 32, through the housing 100, to the heat-dissipative fins 104.

While hidden from view in the figure, the amplifier 16 further includes a controller card 107 which is connectable to receive externally-generated signals by way of a coupler 108. Externally-generated power is also applied to the amplifier 16 by way of the coupler 108. The externally generated signals are conditioned (regulated) by circuits on controller card 107, then transmitted to the circuit elements, such as the transistor-amplifiers, on the circuit board section 32A through feed-through elements 111.

The input and output elements 34 and 92 are shown to be positioned in-line with one another along a side face surface of the housing 100. Connections from and to a microwave receiver and microwave transmitter are effectuated by way of the elements 34 and 92, respectively.

Figure 6:
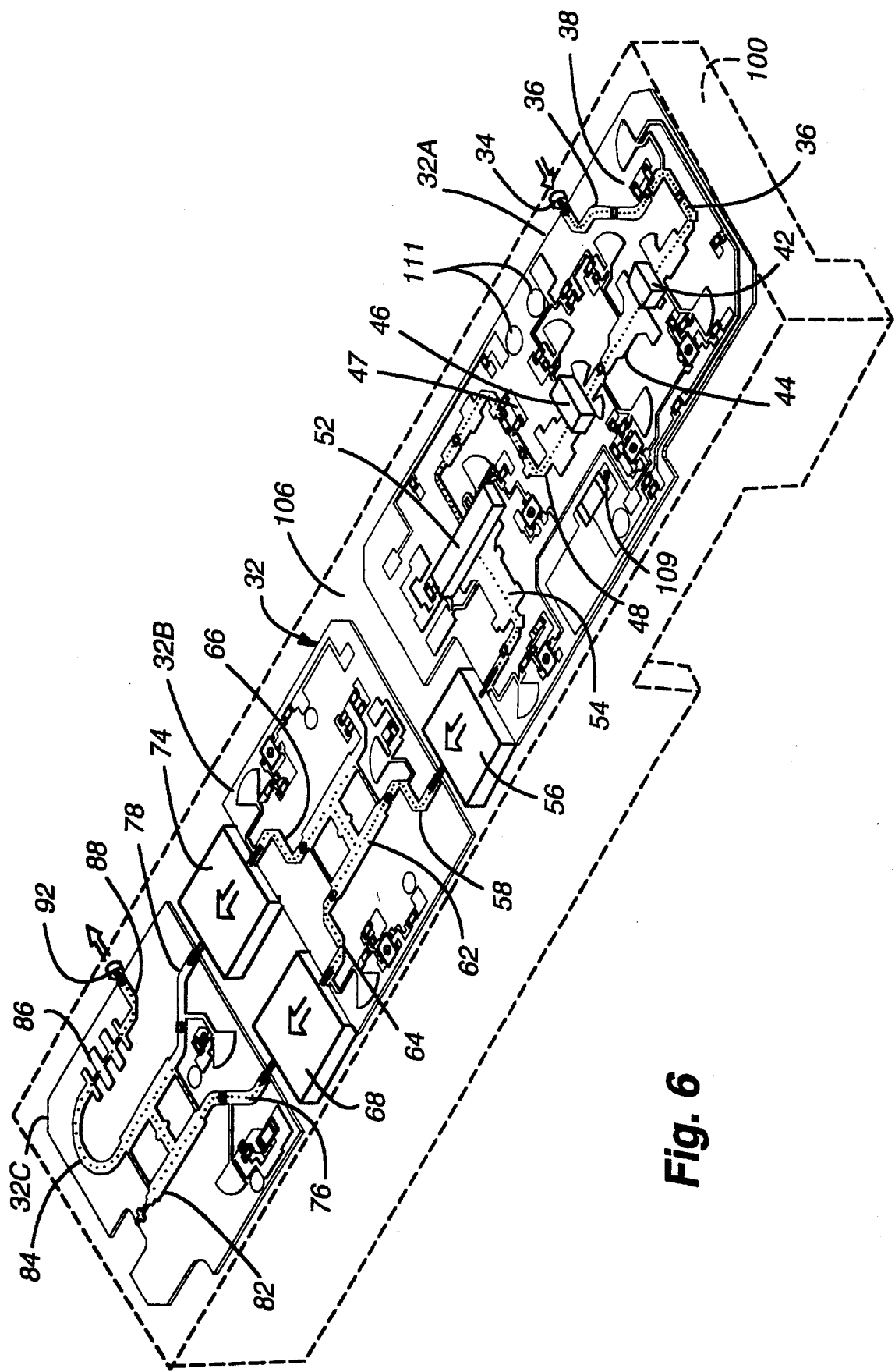
FIG. 6 is an enlarged, perspective view of the circuit elements of the amplifier shown in FIG. 5.

The enlarged view of FIG. 6 illustrates the circuit elements of the amplifier 16 including the relationship of the circuit elements, the circuit board 32, and the surface of the housing upon which the circuit elements and circuit board 32 seat. The circuit board sections 32A–C seat directly upon a seating surface 106 of the housing.

Again, microwave signals applied to the amplifier 16 are applied to the input element 34 positioned at a first side surface of the housing 100. The input microstrip 36 is formed upon the circuit board section 32A to permit transmission of the microwave signals therealong.

A temperature compensating diode 38 (together with associated circuitry) is positioned in-line with the input microstrip 36. As described previously, the characteristics of the diode 38 changes in response to temperature variations of the amplifier 16 to counteract for such temperature variations. The diode, for instance, could be a PIN diode.

Transmission of the microwave signals applied to the amplifier 16 continue along the input microstrip 36 which is coupled to the first amplifier stage 42, formed of a transistor-amplifier. Amplified signals generated by the first amplifier stage 42 are transmitted along the microstrip 44 to be applied to the second amplifier stage 46. The second amplifier stage amplifies the signals applied thereto with a second level of amplification and generates amplified signals upon the microstrip 48 to be applied to the third amplifier stage 52. However, the amplified signal from the second amplifier stage 46, transmitted along the microstrip 48, first passes through a leveling pad 47. The leveling pad 47 decreases the power of the amplified signal output from the second amplifier stage 46 in order to prevent overdrive of the third amplifier stage 52.

The third amplifier stage 52 amplifies the signals applied thereto with a third level of amplification and generates amplified signals on the microstrip 54. The microstrip 54 extends to the fourth amplifier stage 56 which amplifies the signals received thereat with a fourth level of amplification. The fourth amplifier stage 56 is mounted directly upon the surface 106 of the housing 100, and between the circuit board sections 32A and 32B. Thermal energy generated as a byproduct of operation of the amplifier stage 56 is conducted directly to the housing and to the fins 104 thereof. The amplified signals generated by the amplifier stage 56 are transmitted upon microstrip 58 formed upon the circuit board section 32B and the signals are split into two separate portions by the signal splitter 62. The signal splitter 62 includes the first microstrip signal path 64 and the second microstrip signal path 66 which are coupled to the amplifiers 68 and 74, respectively, of the fifth amplifier stage 72 (shown in dash in FIG. 2). The amplifiers 68 and 74 are also directly mounted upon the surface 106.

The amplifiers 68 and 74 amplify the signals applied thereto with fifth levels of amplification. Amplified signals generated by the amplifiers 68 and 74 are generated on the microstrip signal paths 76 and 78 which extend to and are coupled with the microstrip signal recombiner 82. Signal paths 76 and 78 are recombined by the recombiner 82, to form the single microstrip path 84.

The signal path 84 extends to the microstrip low pass filter 86 which filters the microwave signals applied thereto and forms filtered signals for transmission upon the output microstrip 88. The output microstrip 88 extends to the output element 92, again shown to be positioned upon the first side face surface of the housing 100, in-line with the input element 34.

Biasing circuitry and other control circuitry is further formed upon the circuit board 32. The various biasing and other control circuitry is operative in conventional manner to bias and control the various elements disposed upon the circuit board 32. In one embodiment, the biasing and control circuits are coupled to the control board 107 (shown in FIG. 5).

A plurality of vias, of which via 109 is exemplary, are formed to extend through the circuit board 32. The vias form grounds paths to the circuit side of the board. The vias additionally form conductive paths for conducting thermal energy generated as a byproduct of amplifier circuit operation to the housing 100 and thereaway. The vias 109 also function to bring the ground potential to the microstrip.

Because the amplifier 16 amplifies the microwave signals applied thereto through the use of gallium arsenide transistor-amplifiers, amounts of power required to power the circuitry of the amplifier 16 is reduced relative to the power requirements of a conventional TWT. A lesser amount of thermal energy is also created during operation of the amplifier 16 in contrast with a conventional TWT. Because the amplifier 16 is of dimensions corresponding to the dimensions of a conventional, TWT, the amplifier 16 can be substituted for a conventional TWT merely by removing the conventional TWT, and its associated power supply, out of a microwave repeater station, and replacing the TWT with the amplifier 16.

Presently-preferred embodiments of the present invention have been described with a degree of particularly. The previous descriptions are of preferred examples for implementing the invention, and the scope of the invention should not necessarily be limited by this description. The scope of the present invention is defined by the following claims.

What is claimed is:

1. In a microwave signal repeater station which receives and retransmits microwave signals, a solid state power amplifier for amplifying a microwave signal from a microwave receiver to a microwave transmitter, said solid state power amplifier comprising:

a supportive housing having a first side, a second side opposing said first side, a first end, and a second end opposing said first end;

a coupler, positioned at said first end of said housing, for applying power from the microwave repeater station to the solid state power amplifier;

an input element positioned at the first side of said supportive housing, said input element for receiving microwave signals from said microwave receiver;

an input transmission line coupled to said input element, said input transmission line for transmitting the microwave signals applied to the input element therealong;

at least one transistor-amplifier element coupled to receive the microwave signals transmitted upon said input transmission line, said at least one transistor-amplifier element for amplifying the microwave signals;

an output transmission line coupled to said transistor-amplifier element, said output transmission line for transmitting the microwave signals once amplified by said transistor-amplifier element therealong;

an output element positioned at the first side of said supportive housing, positioned in-line with said input element, and coupled to said output transmission line, said output element for receiving the microwave signals transmitted along said output transmission line and coupling said microwave signals to said microwave transmitter; and a heat-dissipative element, positioned at said second end of said housing, for dissipating heat generated during transmission of the microwave signals along said input and output transmission lines by said at least one transistor-amplifier.

2. The solid state power amplifier of claim 1 wherein said input transmission line comprises a microstrip line.

3. The solid state power amplifier of claim 1 wherein said at least one transistor-amplifier element comprises a cascaded series of amplifier stages, wherein successive ones of said amplifier stages are interconnected by interconnecting transmission lines.

4. The solid state power amplifier of claim 3 wherein said interconnecting transmission lines comprise microstrip lines.

5. The solid state power amplifier of claim 3 wherein at least one of said interconnecting transmission lines comprises a signal splitter forming a first and a second signal path forming parallel transmission paths for transmitting the microwave signals therealong.

6. The solid state power amplifier of claim 5 wherein a first amplifier stage of said cascaded series of amplifier stages comprises a first amplifier coupled to said first signal path and a second amplifier coupled to a second signal path, said first and second amplifiers, respectively, for amplifying the microwave signals applied thereto, respectively, on said first and said second signal paths.

7. The solid state power amplifier of claim 6 wherein at least one of said interconnecting transmission lines comprises a signal recombiner having a third and a fourth signal path coupled to said first and second amplifiers, respectively, of the first amplifier stage of said cascaded series of amplifier stages, said third and fourth signal paths for recombining the microwave signals amplified by said first and second amplifiers, respectively.

8. The solid state power amplifier of claim 1 wherein said output transmission line comprises a microstrip line.

9. The solid state power amplifier of claim 1 wherein said housing and said heat dissipative element are integrally formed.

10. The solid state power amplifier of claim 9 wherein said heat dissipative element comprises a heat sink having a plurality of heat-dissipative fins.

11. The solid state power amplifier of claim 10 further comprising a circuit board, said input and output transmission lines, respectively, and said at least one transistor-amplifier element positioned upon said circuit board.

12. The solid state power amplifier of claim 1 wherein said input element is positioned adjacent to said first end of said supportive housing.

13. The solid state power amplifier of claim 1 wherein said output element is positioned adjacent to said second end of said supportive housing.

14. The solid state power amplifier of claim 1 wherein said input element is positioned adjacent to said first end of said supportive housing, and said output element is positioned adjacent to said second end of said supportive housing.

15. The solid state power amplifier of claim 1 wherein said coupler is positioned adjacent to said first input element.

16. In a microwave signal repeater station which receives and retransmits microwave signals, an improvement of a solid state power amplifier, said solid state power amplifier comprising:

a supportive housing;

an input element positioned at a first side of said supportive housing, said input element for receiving microwave signals;

an input transmission line coupled to said input element, said input transmission line for transmitting the microwave signals applied to the input element therealong;

at least one transistor-amplifier element coupled to receive the microwave signals transmitted upon said input transmission line, said at least one transistor-amplifier element for amplifying the microwave signals;

an output transmission line coupled to said transistor-amplifier element, said output transmission line for transmitting the microwave signals once amplified by said transistor-amplifier element therealong;

an output element positioned at the first side of said supportive housing, positioned in-line with said input element, and coupled to said output transmission line, said output element for receiving the microwave signals transmitted along said output transmission line;

a passive, heat-dissipative element positioned together with said supportive housing, said heat-dissipative element for dissipating heat generated during transmission of the microwave signals along said input and output transmission lines, respectively, and amplified by said at least one transistor-amplifier, wherein said heat dissipative element comprises a heat sink having a plurality of heat-dissipative fins; and a circuit board having at least one via extending through said circuit board, said via forming a conductive path for conducting heat energy generated upon said circuit board to said housing and the heat-dissipative element, wherein said input and output transmission lines, respectively, and said at least one transistor-amplifier element are positioned upon said circuit board.

17. In a microwave repeater station for retransmitting microwave signals received at the station, a method for amplifying the microwave signals between a microwave receiver and a microwave transmitter, the method comprising the steps of:

forming a heat-dissipative housing to be adapted for positioning in the repeater station, said heat-dissipative housing having a first side, a second side opposing said first side, a first end, and a second end opposing said first end;

applying the microwave signals received at the microwave repeater station to an input element positioned at the first side of the heat-dissipative housing;

transmitting the microwave signals applied to the input element along an input microstrip transmission line positioned between the input element and at least one transistor-amplifier element;

amplifying the microwave signals with the at least one transistor-amplifier element;

transmitting the microwave signals amplified by the at least one transistor-amplifier along an output microstrip transmission line;

applying the microwave signals transmitted along the output microstrip transmission line to an output element positioned at the first side of the heat-dissipative housing, in-line with the input element; and dissipating heat energy generated during said first and second steps of applying, said first and second steps of transmitting, and said step of amplifying, through the heat-dissipative housing.

18. The method of claim 17, wherein said first applying step further comprises positioning said input element adjacent to said first end of said heat-dissipative housing; and said second applying step further comprises positioning said output element adjacent to said second end of said heat-dissipative housing.

19. The method of claim 17, further comprising the steps of:

forming a circuit board having at least one via extending through said circuit board, said via forming a conductive path for conducting heat energy generated upon said circuit board to said housing and the heat-dissipative element; and positioning said input and output microstrip transmission lines and said at least one transistor-amplifier element upon said circuit board.

* * * * *